US007834678B2

(12) United States Patent
Niessen et al.

(10) Patent No.: US 7,834,678 B2
(45) Date of Patent: Nov. 16, 2010

(54) CIRCUIT ARRANGEMENT AND METHOD OF DRIVING A CIRCUIT ARRANGEMENT

(75) Inventors: Patrick Catharina Johannes Gerardus Niessen, Eindhoven (NL); Ramon Antoine Wiro Clout, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 5 days.

(21) Appl. No.: 12/092,750

(22) PCT Filed: Nov. 1, 2006

(86) PCT No.: PCT/IB2006/054038

§ 371 (c)(1),
(2), (4) Date: May 6, 2008

(87) PCT Pub. No.: WO2007/054856

PCT Pub. Date: May 18, 2007

(65) Prior Publication Data

US 2008/0265981 A1 Oct. 30, 2008

(30) Foreign Application Priority Data

Nov. 8, 2005 (EP) ................................ 05110481

(51) Int. Cl.
*H03K 17/687* (2006.01)

(52) U.S. Cl. ..................................................... 327/434

(58) Field of Classification Search ................. 327/427, 327/434, 436

See application file for complete search history.

(56) References Cited

U.S. PATENT DOCUMENTS 4,743,897 A * 5/1988 Perez ......................... 345/212
6,140,687 A * 10/2000 Shimomura et al. ......... 257/401
6,153,980 A * 11/2000 Marshall et al. ......... 315/200 A
6,778,001 B2 * 8/2004 Mayama et al. ............. 327/427
7,425,943 B2 * 9/2008 Furukawa .................. 345/102
2002/0175826 A1 11/2002 Hutchison et al.
2004/0090403 A1 5/2004 Huang
2004/0160199 A1 8/2004 Morgan et al.
2004/0207341 A1 10/2004 Callahan
2005/0062481 A1 3/2005 Vaughn et al.
2005/0243022 A1 11/2005 Negru

FOREIGN PATENT DOCUMENTS

DE 10018760 A1 10/2001
DE 10103611 A1 8/2002
DE 10358447 B3 5/2005
GB 2278717 A 12/1994

* cited by examiner

*Primary Examiner*—Lincoln Donovan
*Assistant Examiner*—William Hernandez

(57) ABSTRACT

The present invention relates to controlling switches in a series connection of electrical devices, in particular to a circuit arrangement, and method of operating same, in which a transistor switch (44, 54) is used to control operation of the devices (12, 14). Because the transistor switches need a gate-source voltage difference, but on the other hand are connected with their source (s) and drain (d) to the main circuit branch, this voltage difference is built up by providing a control current (Ii, I2) over e.g. a resistor (42, 52). This control current (Ii, I2) enters the main current (I), which would influence the operation of the devices, e.g. LEDs (12, 14). In order to correct this, the control current (I2) is corrected for the values of one or more upstream control currents (I2), e.g. through adapting the pulse width in pulse width modulation.

5 Claims, 2 Drawing Sheets

CIRCUIT ARRANGEMENT AND METHOD OF DRIVING A CIRCUIT ARRANGEMENT

Figure 1:
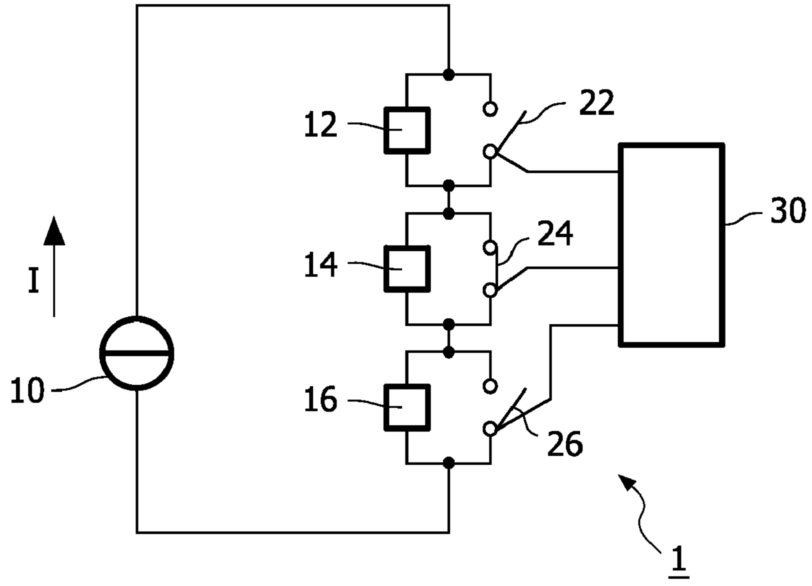

The present invention relates to a circuit assembly, comprising a connection for an electrical power source for supplying an electrical current to the circuit assembly, at least one first electrical device and at least one second electrical device, connected in series therewith, at least one semiconductor switch for controlling said first electrical device, and comprising at least a gate, a source and a drain, and connected in parallel with said first electrical device by means of the drain and the source, and a control unit arranged for supplying a first control signal to the semiconductor switch and a second control signal to said second electrical device, wherein said second electrical device is present downstream of said first electrical device and said semiconductor switch, in the direction of a current flow when the circuit arrangement is in use.

A series connection of transistor controlled electrical devices is well-known. For example, U.S. Pat. No. 6,153,980 discloses a LED array having an active shunt switch arrangement, wherein a plurality of LEDs connected in series each have an active shunt, such as a power MOSFET, connected there across. Digital logic is connected to each shunt switch, and serves to sequentially activate the active shunts.

Series connections of electrical devices are useful in that the electrical current that passes through each device is the same. Since the performance of many types of electrical devices depends on the current, this series connection is a useful feature to set the electrical working conditions for the devices.

When using an active semiconductor switch in a series connected circuit arrangement of electrical devices, the following problem arises. The semiconductor switch is connected in parallel with the electrical device or devices with its source and its drain, while its gate is not so connected. The switch needs a certain voltage difference between its gate and source in order to be in a closed or open state, to hence determine whether to shunt the electrical device or not. However, the voltage at the source of a particular semiconductor switch depends on the state of the electrical devices upstream of that particular semiconductor switch, and especially of other semiconductor switches upstream of that particular semiconductor switch. Hence, by simply relying on providing a particular voltage at the gate, the above mentioned voltage difference is not well-defined, which is a disadvantage. For example, it may occur that the semiconductor switch is partially conductive, which means there is an undesirable energy loss in the switch, and an unwanted situation.

It is an object of the present invention to provide a circuit arrangement of the kind mentioned in the preamble, that is able to provide improved control over the performance of the semiconductor switch controlled electrical device(s).

Said object is achieved according to the invention with a circuit arrangement of the type mentioned above, wherein at least one electrical component is provided between the gate and the source, across which electrical component a voltage difference develops when a current is sent through the component, wherein furthermore the first control signal comprises a control current signal to the gate and to the electrical component, wherein the control unit is arranged to adapt the second control signal in dependence on the first control signal.

Ordinarily, ways of providing a well-defined voltage difference that rely on providing a current across an electrical component interfere with the above mentioned advantage of an equal current for each electrical device in the series connection, because that current necessarily adds to the current through the parallel connection of electrical device and source-drain connection of the semiconductor switch. According to the invention, use is made of a local, floating voltage that creates a well-defined voltage difference across the semiconductor switch, while the effect of the current signal through the electrical component and into the series connection of electrical devices is corrected by having the control unit adapt the control signals for each semiconductor switch downstream of the switch under consideration. Note that this floating voltage is particularly useful in series connections of large numbers of devices, since otherwise it becomes increasingly difficult to supply a well-defined source voltage for the transistor, because the absolute voltages will change in dependence on control signals upstream.

Note that simply providing an "absolute" voltage at the source or drain of the switch is not reliable, also because in cases where many electrical devices are connected in series, such as is often the case for e.g. multi-LED applications, the absolute value of said voltage will amount to the number of LEDs times the LED voltage, which may become several hundred volts. This cannot be tolerated for many semiconductor switches, e.g. due to specifications or safety regulations.

According to the present invention, the effect of the extra current in the series connected downstream electrical devices is known, since this only depends on the properties of the electrical component and the current signal, which are known. Hence, it is possible for the control unit to predict the effect of the upstream current signals on the downstream current. The control signals for downstream switches are adapted in dependence on that knowledge, such as with a look-up table. Other methods will be described below.

Although it suffices when a connection to a power source is provided, it may be even more advantageous to provide and include a power source. Preferably, the power source comprises a current source, which supplies a substantially constant current.

In principle, each type of semiconductor switch is allowed in the present invention, such as a bipolar transistor. However, the invention is very advantageous for a circuit arrangement wherein the semiconductor switch comprises an insulated gate transistor switch. In particular, the insulated gate transistor switch comprises a JFET or a MOSFET. In these cases, the effects and advantages may become apparent in that the rise-time of these switches depends on the current between gate and source, since first a capacitance of the gate-source must be charged (or discharged) in order for the transistor to be able to switch from a non-conductive to a conductive state (or vice versa). When the current applied is very low, this may take a relatively long time, which is undesirable. The invention allows a good control over this period of time, by being able to adapt the circuit design towards a desired switch behavior, as will be explained below. It is remarked here that the current signal is of course divided between the electrical component across which a voltage is produced, and the gate of the semiconductor switch. However, in almost all cases, the gate (leak) current is so much lower than the current through the electrical component, that the gate current may be ignored for all practical purposes. However, for example in the case of a bipolar transistor, it will often be required to include the gate current. Depending on the transistor characteristics, a correction for the contribution of the gate current to the total control current may be made. This will be further elucidated in the description of preferred embodiments.

Note that the at least one electrical component is meant to be a separate component, not an inherent non-physically separate "component", such as stray capacitance.

In a special embodiment, the electrical component comprises a resistor. This is an extremely simple, small and cheap feature that still performs its duty in that it develops a voltage across it when a (control) current flows through it. The voltage is very well controllable, as compared to other passive components, such as capacitors and inductances, although their use is not excluded.

In particular, the resistor has a resistance of between 0.5 and 500 kΩ, preferably between 1 and 100 kΩ. With such values of the resistance, it can easily be ensured that the switch opens/closes sufficiently fast, in other words that the rise-time is sufficiently short for a reliable operation.

In a special embodiment, the second electrical device comprises an additional insulated gate semiconductor switch, for controlling said second electrical device, and comprising at least a gate, a source and a drain, and connected in parallel with said second electrical device by means of the drain and the source. This arrangement has an advantage that the second electrical device may be controlled by the same control unit, and in the same way, as the first electrical device. Note that other ways of control, as well as other control units are possible as well. Note furthermore that a plurality of separate control units for controlling various electrical devices is deemed to be included in the expression "control unit" as used in this document.

In a special embodiment, the first and/or second electrical device comprises a LED. LEDs are often used in large numbers, and furthermore are often used in a series connection, as they have a performance, viz. light output, that is rather dependent on current through the LED. Hence a critical control of the output of the LED is desirable, and can be obtained with the arrangement according to the invention.

In a particular embodiment, the first and/or second control signal comprises a pulse width modulated (PWM) current signal having a duty cycle. As is known in the art, a pulse width modulation signal is a control signal that comprises pulses emitted in a regular fashion, with a predetermined frequency, and having a controllable width that determines the strength of the pulse. It may be normally HIGH or normally LOW. This type of control signal is used e.g. to be able to dim lamps and yet always have the same ON current, which is desirable in that the properties of the electrical device need to be known only in two situations, instead of a continuous range of (current) conditions. For example, always having the same ON current ensures that the gate-source voltage difference is independent of other, upstream control currents. The switches will thus always switch equally fast, etc. Similar considerations hold for the circuit arrangement as a whole.

In a special embodiment, the duty cycle of the second control signal is dependent on the first control signal. This is an elaboration of the invention, wherein for example a momentary value of the first control signal (for very fast adaptation of the second control signal) or an average value or duty cycle of the first control signal (for less fast adaptation of the second control signal) is used to adapt the duty cycle of the second control signal. In pulse width modulation, the duty cycle is used to express the percentage of the time that the signal value is not the standard value. For example, in the case of a normally LOW signal, if the frequency is 100 Hz, and hence the pulse time is 10 ms, and the signal is HIGH during 2 ms each pulse, the duty cycle is 0.2, or 20%. This may e.g. be used if it is desired to drive a LED at 20% of its nominal intensity value. Now suppose that one other LED upstream of this LED under consideration is switched to a different intensity value, then that corresponds to a different control signal of that other upstream LED. This in turn means that a different control current is sent into the series connection, and hence the total current as seen by the LED under consideration changes. Hence, a correction of the control signal to the LED under consideration has to be adapted, and the control current has to be made either higher or lower (at least on average), or similarly the duty cycle for the LED under consideration has to be adapted.

The way in which other, upstream control signals are used to adapt a particular control signal is not limited. Often, a computer or similar circuitry can be provided that is able to process the other, upstream control signals in order to determine an appropriate control signal. Thereto, knowledge of the total circuit arrangement may be used in the form of a look-up table, which states what control signal should be supplied to a particular switch/device, knowing all upstream control signals. Alternatively, it is possible to use a current sensor device arranged to provide a current reading for the particular device, on the basis of which the control unit may determine the appropriate control signal. For example, in each of the above cases, a PWM signal for the particular switch/device may be adapted.

In a particular embodiment, the circuit arrangement of the invention comprises a plurality of first and second electrical devices, that are connected in series, and a plurality of semiconductor switches that are each connected in parallel with one or more of the plurality of first and second electrical devices, wherein the control unit is arranged to provide each of the semiconductor switches with a respective control signal, and wherein the control unit is furthermore arranged to adapt the respective control signal of each particular semiconductor switch in dependence on all of the respective control signals for all of the semiconductor switches upstream of said particular semiconductor switch. In this embodiment, the advantages of the invention are used in a more complex setting, in which for higher numbers of devices, in particular 10 or more, or even 50 or more, first and/or second devices, such as LEDs, are controlled by a number of transistors. It is repeated here that a particular advantage is that it is possible to define a suitable voltage difference between the gate and source of a particular semiconductor switch.

Note that the number of first and/or second semiconductor switches need not correspond to the number of first and/or second electrical devices, since in each case one or more first and/or second electrical devices may be controlled by a single first or second semiconductor switch. It is also possible to consider this situation as one in which an electrical device comprises a plurality of subdevices.

In a particular embodiment, the circuit arrangement comprises a first, second and third electrical device, connected in series, and each having connected in parallel thereto a respective semiconductor switch that is able to receive a respective control signal from a control unit, wherein the control signal for a particular semiconductor switch is dependent of the respective control signals for all semiconductor switches upstream of said particular semiconductor switch. Preferably, the first, second and third electrical devices each comprise LEDs of a different color. For example, the first devices are red LEDs, the second devices are green LEDs, and the third devices are blue LEDs. Even more preferably, the circuit arrangement further comprises a fourth LED, with a color that differs from the colors of the first, second and third LEDs. These embodiments are very advantageous for offering good color and intensity control of a LED arrangement. For example, the well-known RGB system is used, having a red, a green and a blue LED. Alternatively, a fourth color is added, such as the RGBA system, in which an amber colored LED is added, for better color rendering. Note that it is also possible to add one or more additional sets of first through third, or even fourth, electrical devices, connected in series and/or parallel with the first set of first through third or fourth electrical devices. Advantageously, the additional sets also comprise semiconductor switches connected in accordance with the present invention.

The present invention also relates to a method of driving a circuit arrangement with at least one first electrical device and at least one second electrical device connected in series therewith, by means of a semiconductor switch for controlling said first electrical device and comprising at least a gate, a source and a drain, and connected in parallel with said first electrical device by means of the drain and the source, wherein said second electrical device is present downstream of said first electrical device and said semiconductor switch, in the direction of a current flow when the circuit arrangement is in use, the method comprising providing a first control signal between the gate and the source, that switches the semiconductor switch in order to control the first electrical device, providing a second control signal to control the second electrical device, wherein the second control signal is determined in dependence on the first control signal. The advantages of this method over prior art methods correspond to the advantages of the circuit arrangement of the present invention. A discussion thereof has been given hereinabove. In particular, the method may be applied to the circuit arrangement of the present invention.

In a particular embodiment, providing the first control signal comprises providing a resistive element between the gate and the source and providing a current signal through the resistive element, and wherein the second control signal is determined in dependence on the value of the current signal. Such a resistive element allows a simple and cheap way of providing a well-defined voltage with an also well-defined current. By appropriately selecting a resistance value, the rise-time of the semiconductor switch may be sufficiently short. Suitable values are between about 500Ω and 500 kΩ, in particular between about 1 and 100 kΩ.

In a special method, a plurality of first and second electrical devices is provided, that are connected in series, as well as a plurality of semiconductor switches, that are each connected in parallel with one or more of the plurality of first and second electrical devices, and that each receive a respective control signal, wherein the respective control signal of each particular semiconductor switch is determined in dependence on all of the respective control signals for all of the semiconductor switches upstream of said particular semiconductor switch. In this embodiment, the method of the invention is performed in a more complex situation, and provides all advantages of an individually adapted and corrected control signal for all devices that may be influenced by upstream control signals.

These and other objects, features and advantages of the present invention may become more readily apparent from the following detailed description of non-limiting and exemplary embodiments, taken in conjunction with the drawing, in which:

FIG. 1 diagrammatically shows a circuit arrangement according to the present invention.

Figure 2:
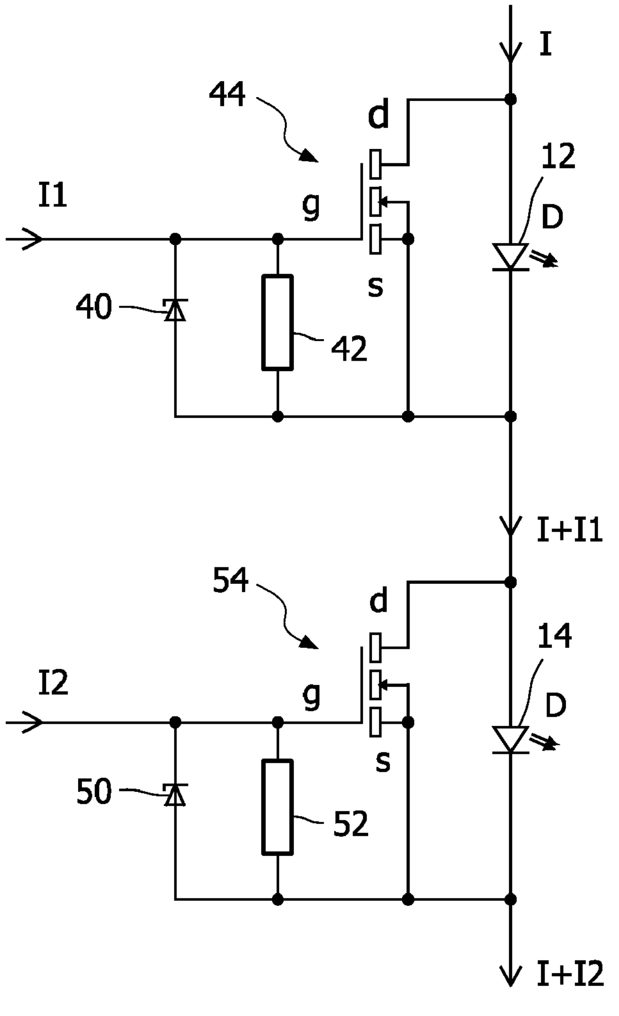

FIG. 2 schematically shows a detail of a particular embodiment of the circuit arrangement of the present invention.

Figure 3:
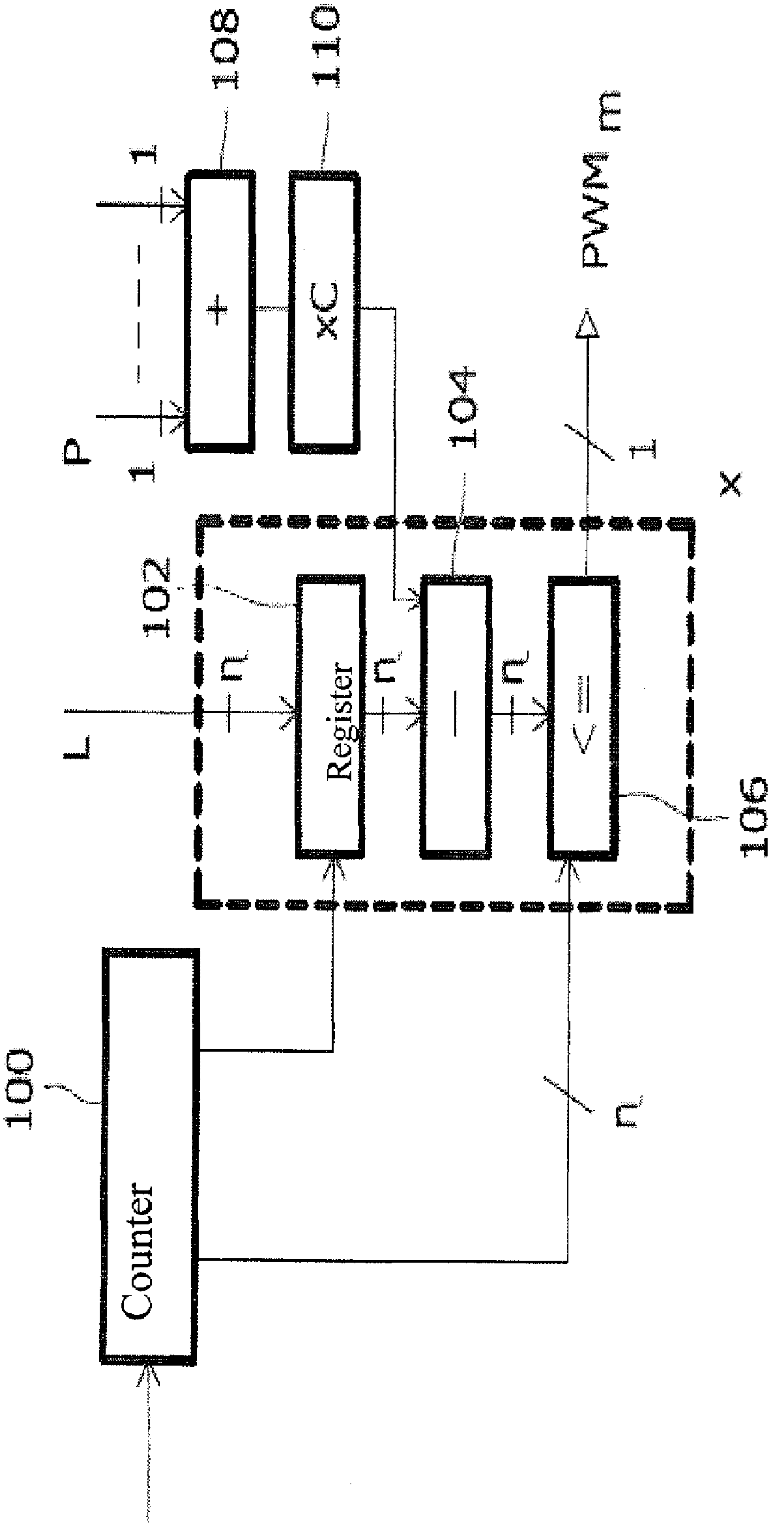

FIG. 3 shows a flow chart of a method according to the invention.

FIG. 1 diagrammatically shows a circuit arrangement according to the present invention.

Herein, 10 denotes a current source for a current I in the direction of the arrow. Three electrical devices 12, 14, 16 are indicated as well as three switches 22, 24, 26, and a control unit 30. As shown here, the current source 10 has been included in the circuit arrangement 1, but it is also possible to provide only a connection to an external current source. The current source is not particularly limited, but may be selected in accordance with the current and power requirements of the electrical devices used.

The devices 12, 14, 16 are denoted only very generally, and their number may also be 2, as well as 4, 5, and upwards. Here, every electrical device 12, 14, 16 has its own switch 22, 24, 26, respectively, connected in parallel with only one electrical device. Note that it is possible to provide additional electrical devices in series and/or in parallel to the three devices shown here. The switches 22, 24, 26 may also control each more than one electrical device. The presently shown embodiment comprises for example three differently colored LEDs, for an RGB system.

The control unit 30 is shown to control each switch 22, 24, 26, although it is possible to provide a control unit having several control sub-units that each control one or more of the plurality of switches 22, 24, 26. The control unit 30 will often be a computer or similar control circuitry.

The invention relates to the effects that controlling the switches 22, 24 has on the control of downstream switches 24, 26, and correction of the latter control.

FIG. 2 schematically shows a detail of a particular embodiment of the circuit arrangement of the present invention. Herein, 12 and 14 are a first and a second LED, respectively. A first and a second MOSFET switch have been indicated with 44 and 54, respectively. Each switch has a gate g, a drain d and a source s as indicated.

Two Zener-diodes and two resistors have been indicated with 40, 50 and 42, 52, respectively.

Furthermore, a main current I, a first control current $I_1$ and a second control current $I_2$ are injected as indicated by the respective arrows.

Suppose a current source (not indicated in the figure) injects a current I into the series connected LEDs. Suppose furthermore that LED 12 is ON, which implies that there is a zero control current $I_1$. Hence, $I+I_1=I$, and the second LED 14 receives the same current.

Suppose now that it is desired to switch off LED 12. This may be achieved by injecting a control current $I_1$ into the first switch 54. Injecting the control current $I_1$ produces a voltage across resistor 42, which likewise produces a voltage between the gate g and the source s. Thereupon, after the rise-time of the switch 44, the switch 44 will start to conduct and shunt the LED 12.

The nett result is that the current I will not go through the LED, but go through the switch 44, at least substantially. However, the control current $I_1$ is added to the current I, and hence $I+I_1\approx I$. This increased current is sent through the second LED 14. This is a clear example that the control signal for the first LED, in other words an upstream electrical device, influences every downstream LED (or electrical device). However, according the invention, this may be corrected as follow. Suppose, for ease of calculation, that the control current $I_1$ is 0.02 I, and suppose furthermore that the intensity of the LED 12 and 14 depends linearly on current. In other words, the second LED 14 will now emit 2% more light. This may be corrected by switching off the second LED 14 during $2/102\times100\%\approx2\%$ of the time. A corresponding PWM control signal may be supplied to the second LED 14 in the form of a PWM second control current $I_2$. This second control current $I_2$ may be supplied to the second switch 54 in a similar fashion to the first control current $I_1$.

All in all, the nett result is that the first LED 12 is switched off, while the second LED 14 emits with the same intensity as before. Of course, it is similarly possible to control each LED 12, 14 completely independently of each other. Note that other devices downstream of the second LED 14 may be controlled in a similar fashion in order to correct influences by the injected control currents $I_1$, $I_2$, et cetera. It is furthermore noted that the “extra” control current is branched off from the main current I that re-enters the current source, by the provision of an electrical connection (not shown) back to the control unit. Via this connection, which closes a control circuit, the control current will flow.

FIG. 3 shows a flow chart of a method according to the invention. Herein, a counter is indicated by 100, a width register 102, a subtractor by 104, a comparator by 106, an adder by 108 and a multiplier by 110.

Briefly, counter 100 cyclically counts from 0 to $2^n-1$, with n the number of bits used, i.e. the resolution. For the switch m that is to be controlled by the pulse width modulated signal PWMm, a desired pulse width is entered into the width register 102, via a clock controlled load-on-carry signal, i.e. the arrow from counter 100 to width register 102. This pulse width may also have a width of n bits, and its value may be based on the desired intensity of the LED. In a non-corrected system, the comparator 106 would determine whether or not the counter 100 value was at least equal to the desired pulse width, in order to generate the HIGH value at the desired counter value. In other words, parts 104 and, of course 108 and 110, would not be present.

According to the invention, this method is corrected. In this case, all pulse width modulation signals of upstream switches, i.e. PWM0 through PWM(m−1), are used. In order to incorporate their effect on the PWMm, their values are added by adder 108, after which the added value is multiplied by a correction value c in multiplier 110. The value thus obtained is subtracted form the width register value.

The correction value c depends for example on a ratio of the average respective control current, such as $I_1$ in FIG. 2, to the main current, such as the LED current I in FIG. 2. This is based on the assumption that the LED intensity is linearly dependent on current. Of course, if other devices are used, a different dependency may prevail, and a different correction factor c, or even a different correction scheme may be utilized. As long as the dependency is known, however, this may be embodied in circuitry or a programmed computer, in order for the control current to be optimally corrected. In the case of e.g. a bipolar transistor, this factor c may include a correction due to the circumstance that only part of the control current passes through the resistive element, while another part passes through the transistor, as a gate current.

The invention claimed is:

1. A method of driving a circuit arrangement with at least one first electrical device and at least one second electrical device connected in series therewith, by means of a semiconductor switch for controlling said first electrical device, the semiconductor switch comprising at least a gate (g), a source (s) and a drain (d), and connected in parallel with said first electrical device by means of the drain and the source, wherein said second electrical device is present downstream of said first electrical device and said semiconductor switch, in the direction of a current flow when the circuit arrangement is in use, the method comprising providing a first control signal between the gate (g) and the source (s), that switches the semiconductor switch, in order to control the first electrical device;

providing a second control signal to control the second electrical device, the second control signal being determined in dependence on the first control signal, wherein providing the first control signal comprises providing a resistive element between the gate (g) and the source (s) and providing a current signal through the resistive element, and wherein the second control signal is determined in dependence on the value of the current signal.

2. The method of claim 1, wherein the circuit arrangement, comprises a connection for an electrical power source for supplying an electrical current to the circuit assembly, at least one first electrical device and at least one second electrical device, connected in series therewith, at least one semiconductor switch for controlling said first electrical device, and comprising at least a gate (g), a source (s) and a drain (d), and connected in parallel with said first electrical device by means of the drain (d) and the source (s), a control unit arranged for supplying a first control signal to the semiconductor switch and a second control signal to said second electrical device, wherein said second electrical device is present downstream of said first electrical device and said semiconductor switch , in the direction of a current flow when the circuit arrangement is in use, wherein at least one electrical component is provided between the gate (g) and the source (d), across which electrical component a voltage difference develops when a current ($I_1$, $I_2$)is sent through the component, wherein furthermore the first control signal comprises a control current signal to the gate (g) and to the electrical component, wherein the control unit is arranged to adapt the second control signal in dependence on the first control signal.

3. The method of claim 1, wherein a plurality of first and second electrical devices is provided that are connected in series, as well as a plurality of semiconductor switches, that are each connected in parallel with one or more of the plurality of first and second electrical devices, and that each receive a respective control signal, wherein the respective control signal ($I_2$) of each particular semiconductor switch is determined in dependence on all of the respective control signals ($I_1$) for all of the semiconductor switches upstream of said particular semiconductor switch.

4. A circuit assembly, comprising a connection for an electrical power source for supplying an electrical current to the circuit assembly, a first electrical device and a second electrical device, connected in series with the first electrical device, a semiconductor switch configured to control the first electrical device, the semiconductor switch comprising a gate (g), a source (s) and a drain (d), and connected in parallel with said first electrical device via the drain (d) and the source (s), a control unit configured to supply a first control signal to the semiconductor switch and a second control signal to said second electrical device, wherein the second electrical device is connected to the first electrical device and the semiconductor switch, and a resistor provided between the gate (g) and the source (d), wherein a voltage difference develops when a current ($I_1$, $I_2$) travels through the resistor, wherein the first control signal comprises a control current signal to the gate (g) and to the resistor, wherein the control unit is arranged to adapt the second control signal in dependence on the first control signal.

5. The circuit arrangement of claim 4, wherein the resistance has a value of between 0.5 kΩ and 500 kΩ.

* * * * *